(12) United States Patent
Hotta

(10) Patent No.: US 10,479,083 B2
(45) Date of Patent: Nov. 19, 2019

(54) PEELING METHOD OF COVER MEMBER AND MANUFACTURING METHOD OF LIQUID EJECTING HEAD

(71) Applicant: SEIKO EPSON CORPORATION, Tokyo (JP)

(72) Inventor: Tatsuro Hotta, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/830,384

(22) Filed: Dec. 4, 2017

(65) Prior Publication Data

US 2018/0162131 A1    Jun. 14, 2018

(30) Foreign Application Priority Data

Dec. 13, 2016    (JP) ................................. 2016-241648

(51) Int. Cl.
    *B41J 2/16*        (2006.01)
    *B32B 37/02*       (2006.01)
    (Continued)

(52) U.S. Cl.
    CPC ............... *B41J 2/1607* (2013.01); *B32B 9/04* (2013.01); *B32B 9/045* (2013.01); *B32B 27/42* (2013.01); *B32B 37/02* (2013.01); *B32B 38/10* (2013.01); *B32B 43/006* (2013.01); *B41J 2/161* (2013.01); *B41J 2/1623* (2013.01); *B41J 2/1626* (2013.01); *B41J 2/1628* (2013.01); *B41J 2/1629* (2013.01); *B41J 2/1631* (2013.01); *B41J 2/1632* (2013.01); *B41J 2/1642* (2013.01); *B41J 2/1646* (2013.01); *B32B 2386/00* (2013.01);
    (Continued)

(58) Field of Classification Search
    CPC ...... B41J 2/1607; B41J 2/1646; B41J 2/1642; B41J 2/1632; B41J 2/1631; B41J 2/1629; B41J 2/1628; B41J 2/1623; B41J 2/161; B41J 2/1626; B32B 38/10; B32B 27/42; B32B 43/006; B32B 37/02; B32B 9/04; B32B 9/45; B32B 2386/00; B81C 1/00047; B81C 1/00055; B81C 2201/053; B81C 2201/0136
    See application file for complete search history.

(56) References Cited

U.S. PATENT DOCUMENTS 5,996,215 A * 12/1999 Yamazoe ............. H01H 15/005
                                                        156/152

FOREIGN PATENT DOCUMENTS

JP    2004-128147    4/2004
JP    2006-156456    6/2006
(Continued)

*Primary Examiner* — Anita K Alanko
(74) *Attorney, Agent, or Firm* — Workman Nydegger

(57) ABSTRACT

Disclosed is a peeling method of a cover member including forming a recessed portion that opens one side surface of a substrate, on a region different from a region in which a pattern is formed and forming an opening region including the opening of the recessed portion; attaching the cover member so as to cover the one side surface; adjusting a pressure for increasing a pressure within a space formed by the recessed portion and the cover member by attaching the cover member to the substrate to be higher than a pressure on a side opposite to the space with the cover member interposed therebetween; and peeling off the cover member from the substrate, in a state where the pressure within the space is increased by the adjusting of the pressure.

18 Claims, 11 Drawing Sheets

(51) Int. Cl.
*B32B 43/00* (2006.01)
*B32B 27/42* (2006.01)
*B32B 9/04* (2006.01)
*B32B 38/10* (2006.01)
*B81C 1/00* (2006.01)

(52) U.S. Cl.
CPC ...... *B81C 1/00047* (2013.01); *B81C 1/00055* (2013.01); *B81C 2201/053* (2013.01); *B81C 2203/0136* (2013.01)

(56) References Cited

FOREIGN PATENT DOCUMENTS

| | | |
|---|---|---|
| JP | 2008-168549 | 7/2008 |
| JP | 2012-104514 | 5/2012 |

\* cited by examiner

PEELING METHOD OF COVER MEMBER AND MANUFACTURING METHOD OF LIQUID EJECTING HEAD

BACKGROUND

1. Technical Field

The present invention relates to a peeling method of a cover member for peeling off the cover member from a substrate after the cover member is attached to the substrate, and a manufacturing method of a liquid ejecting head.

2. Related Art

As an ink jet type recording head which is a typical example of a micro device such as a liquid ejecting head, for example, there is structure which includes a flow path forming substrate in which a pressure generating chamber communicating with a nozzle opening is formed and a pressure generating unit such as a piezoelectric actuator is formed on one side surface thereof; and a protective substrate joined to one side surface of the flow path forming substrate.

In manufacturing such an ink jet type recording head, when the flow path forming substrate is processed after bonding the flow path forming substrate and the protective substrate, a protective film is attached in order to protect the protective substrate (for example, see JP-A-2008-168549).

Such a cover member needs to be finally peeled off from the protective substrate. Therefore, there is a known peeling method for peeling off the protective film that is the cover member attached to a substrate such as a wafer (for example, see JP-A-2004-128147).

However, when the cover member such as the protective film is peeled off from the substrate, stress is applied to the substrate, warpage occurs in the substrate, and there is a problem that destruction such as cracks occurs.

In addition, if a force for peeling off the cover member is weak, there is a problem that the cover member cannot be peeled off from the substrate.

In addition, if an adhesive force of the cover member to the substrate is lowered, the substrate cannot be reliably protected by the cover member and there is a problem that protection failure occurs.

In addition, for example, even if the cover member is peeled off by heating and softening an adhesive for bonding the cover member, there is a problem that if the adhesive force of the cover member is high, the cover member cannot be peeled off.

Moreover, such a problem is not limited to a manufacturing method of a liquid ejecting head typified by an ink jet type recording head, and is also present in a peeling method of a cover member used for another device.

SUMMARY

An advantage of some aspects of the invention is that it provides a peeling method of a cover member and a manufacturing method of a liquid ejecting head which can protect a substrate with the cover member and in which the cover member is easily peeled off from the substrate to suppress destruction of the substrate.

According to an aspect of the invention, there is provided a peeling method of a cover member including forming a recessed portion that opens one side surface of a substrate, on a region different from a region in which a pattern is formed and forming an opening region including the opening, on the one side surface of the substrate, in the substrate; attaching the cover member so as to cover the one side surface of the substrate; adjusting a pressure for increasing a pressure within a space formed by the recessed portion and the cover member by attaching the cover member to the substrate to be higher than a pressure on a side opposite to the space with the cover member interposed therebetween; and peeling off the cover member which is attached in the attaching of the cover member, from the substrate, in a state where the pressure within the space is increased by the adjusting of the pressure.

In the aspect, the cover member can be deformed in a convex shape on a side opposite to the substrate by increasing the pressure within the space by the adjusting of the pressure and the cover member can be easily peeled off from the substrate with a relatively weak force by allowing gas to enter between the substrate and the cover member.

In the peeling method of a cover member, it is preferable that in the peeling off of the cover member, a region, which is a surface of the cover member on a side opposite to the substrate, and includes at least a part of a region that overlaps with the opening region of the substrate, be pulled in a direction away from the substrate when viewed in a plan view from a stacking direction of the cover member and the substrate. Therefore, the gas expanded in the space between the substrate and the cover member can be effectively kept.

In addition, in the peeling method of a cover member, it is preferable that the region for pulling the cover member include a portion adjacent to the opening region in a region closer to an outer periphery side of the substrate than the opening region when viewed in a plan view from the stacking direction of the cover member and the substrate. According to the configuration, the gas within the space can be moved to an end portion of the cover member, the end portion of the cover member can be peeled off from the substrate first, and the cover member can be easily peeled off from the substrate.

In addition, in the peeling method of a cover member, it is preferable that in the adjusting of the pressure, the pressure within the space be increased by heating the substrate. According to the configuration, since the pressure within the space can be increased only by heating the substrate, a large-scaled device is not necessary and cost can be reduced.

In addition, in the peeling method of a cover member, it is preferable that a temperature of the substrate in the adjusting of the pressure be higher than a temperature of the substrate in the attaching of the cover member. According to the configuration, the cover member can be deformed in a convex shape on a side opposite to the recessed portion.

In addition, in the peeling method of a cover member, it is preferable that a temperature of the substrate after the attaching of the cover member before the adjusting of the pressure be lower than a temperature of the substrate of the attaching of the cover member. According to the configuration, after the attaching of the cover member, unintentional swelling of the cover member can be suppressed and breakage of the cover member can be suppressed during transportation or handling.

In addition, in the peeling method of a cover member, it is preferable that in the forming of the opening region, a plurality of the groove-shaped recessed portions be juxtaposed in a direction intersecting an extension direction of the recessed portions. According to the configuration, bending of the cover member can be suppressed and the cover member can be deformed in the convex shape on the side opposite to the substrate by the adjusting of the pressure.

In addition, in the peeling method of a cover member, it is preferable that in the forming of the opening region, a plurality of columns in which the plurality of the recessed portions are juxtaposed be arranged in a direction intersecting a juxtaposing direction in which the recessed portions are juxtaposed. According to the configuration, bending of the cover member can be suppressed and the cover member can be deformed in the convex shape on the side opposite to the substrate by the adjusting of the pressure.

In addition, in the peeling method of a cover member, it is preferable that the peeling off of the cover member include moving gas within the space to an outer periphery of an interface between the substrate and the cover member, and pinching and peeling off an end portion of the cover member which is peeled from the substrate, by the gas moved in the moving of the gas. According to the configuration, stress applied to the substrate during peeling can be minimized by pinching and peeling off the end portion of the cover member after the end portion of the cover member is peeled off first.

Furthermore, according to another aspect of the invention, there is provided a manufacturing method of a liquid ejecting head including the peeling method of a cover member according to the above-described aspects.

In the aspects, the substrate can be reliably protected by the cover member, destruction of the substrate can be suppressed when the cover member is peeled off from the substrate, and the cover member can be easily peeled off from the substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail with reference to embodiments.

Embodiment 1

Figure 1:
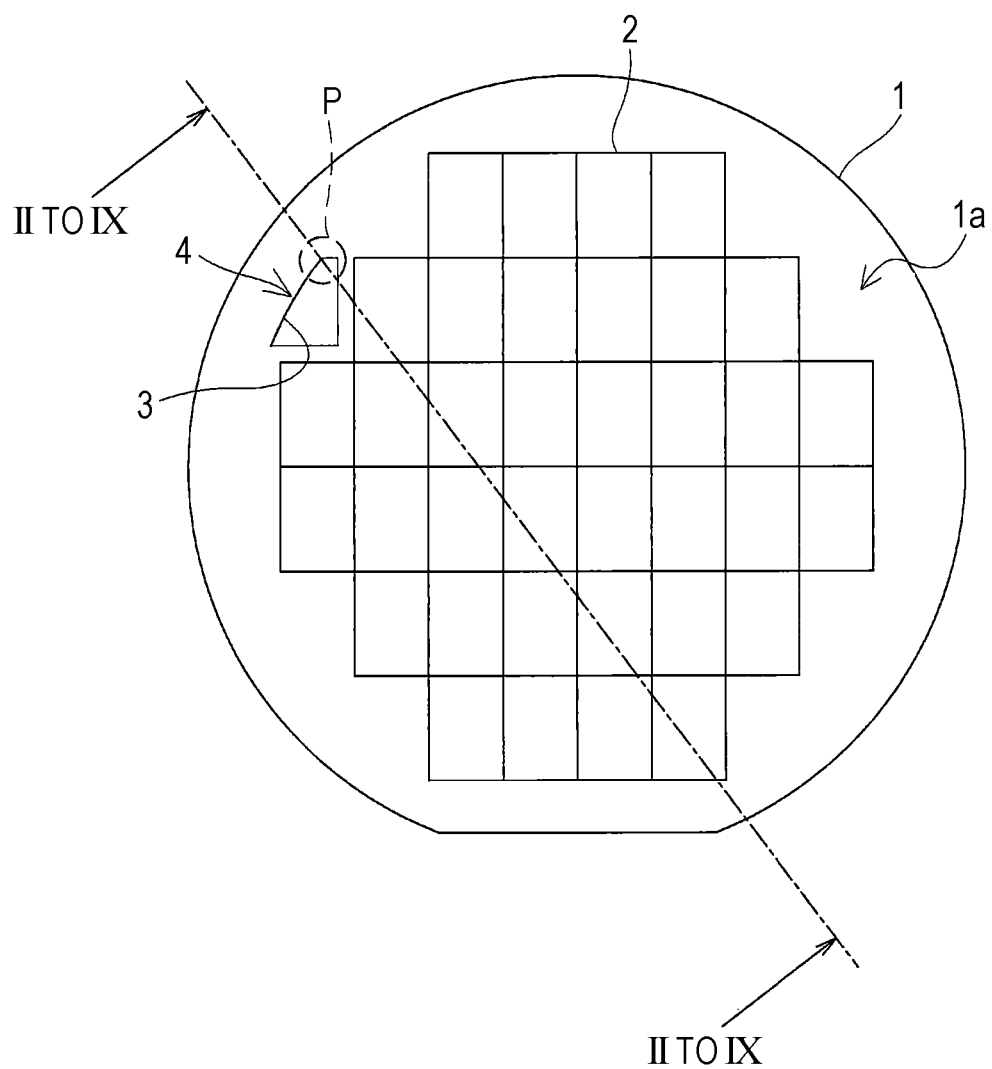
FIG. 1 is a plan view illustrating a substrate.

FIG. 1 is a plan view illustrating a substrate according to Embodiment 1 of the invention.

As illustrated in FIG. 1, a substrate 1 is made of a silicon wafer or the like, and has a pattern region 2 in which various patterns such as wiring, a recessed portion, and a through-hole are formed at a center portion.

Such a substrate 1 is formed by peeling off a cover member 5 after performing processing to attach the cover member to one side surface 1a of the substrate 1 to protect the substrate 1 and form the pattern region 2, or the like on the other side surface 1b of the substrate 1.

Here, a peeling method of the cover member of the embodiment from attachment of the cover member 5 to the substrate 1 to peeling of the cover member 5 from the substrate 1 will be described with reference to FIGS. 2 to 9. Moreover, FIGS. 2 to 9 are sectional views of a main portion of line II TO IX of FIG. 1 illustrating the peeling method of the cover member.

Figure 2:
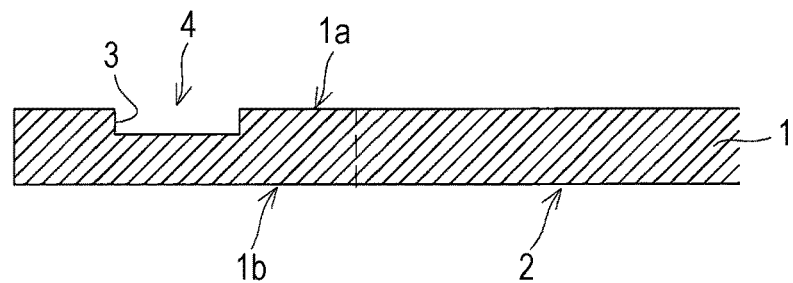
FIG. 2 is a sectional view explaining a peeling method of a cover member.

As illustrated in FIGS. 1 and 2, a recessed portion 3, which opens to the one side surface 1a of the substrate 1, is formed in a region different from the pattern region 2 in which the pattern of the substrate 1 is formed or is forming, in the embodiment, on an outer periphery side that is an outside of the pattern region 2. Therefore, an opening region 4 including an opening of the recessed portion 3 is formed on the one side surface 1a of the substrate 1 (opening region forming step).

Here, the recessed portion 3 means a portion which does not penetrate the substrate 1 in a thickness direction, that is, opens on the one side surface 1a of the substrate 1 and does not open on the other side surface 1b. Such a recessed portion 3 is preferably provided on the outer periphery side of the substrate 1 as much as possible. However, if the recessed portion 3 opens to a side surface that is the outer periphery of the substrate 1, there are problems that chipping of the substrate 1 or generation of foreign matter occurs, and positioning with reference to the outer periphery of the substrate 1 cannot be performed with high accuracy. Therefore, it is preferable that the recessed portion 3 do not open to the side surface that is the outer periphery of the substrate 1 and is provided on the outer periphery side of the substrate 1 as much as possible.

In addition, for example, the recessed portion 3 can be formed by a photolithography method. That is, a photoresist pattern having an opening in the region, in which the recessed portion 3 is formed, is formed on the one side surface 1a of the substrate 1, and then the substrate 1 is etched through the photoresist pattern, and thereby the recessed portion 3 can be formed. Moreover, the substrate 1 may be etched by wet etching or dry etching. For example, in a case where the silicon wafer is used as the substrate 1, the recessed portion 3 can be formed by anisotropic etching (wet etching) using an alkaline solution such as KOH. In addition, an example of as dry etching includes dry etching such as reactive ion etching and ion milling. Of course, the recessed portion 3 may be formed by machining such as grinding, laser processing, or the like. However, the recessed portion 3 is formed by the photolithography method so that the recessed portion 3 can be formed with high accuracy compared to machining or the like. Moreover, it is not necessary to newly provide a step of forming the recessed portion 3 by forming the recessed portion 3 at the same time as another recessed portion, a through-hole, or the like formed in the pattern region 2, and thereby cost can be reduced. Therefore, in the step of forming the recessed portion 3, it is preferable to use the same method as the method of forming the pattern region 2.

In addition, the opening region 4 of the one side surface 1a of the substrate 1 including the opening of the recessed portion 3 means a portion including the opening of the recessed portion 3 which is the one side surface 1a of the substrate 1. For example, the recessed portion 3 may be formed obliquely from the opening toward a bottom surface, but the opening region 4 refers to only portion to which the recessed portion 3 opens. Of course, an area of the recessed portion 3 may gradually increase or gradually decrease from the opening toward the bottom surface, and a shape thereof is not particularly limited.

In addition, in the embodiment, since one recessed portion 3 is provided, a portion to which one recessed portion 3 opens on the one side surface of the substrate 1 is referred to as the opening region 4. Of course, the number of the recessed portions 3 is not limited to one, and a plurality of the recessed portions 3, that is, two or more recessed portions 3 may be provided. In a case where the plurality of the recessed portions 3 are provided, a portion including all the openings of the plurality of the recessed portions 3 is referred to as the opening region 4. That is, the opening region 4 may include the surface of the one side surface 1a of the substrate 1 other than the opening.

Figure 3:
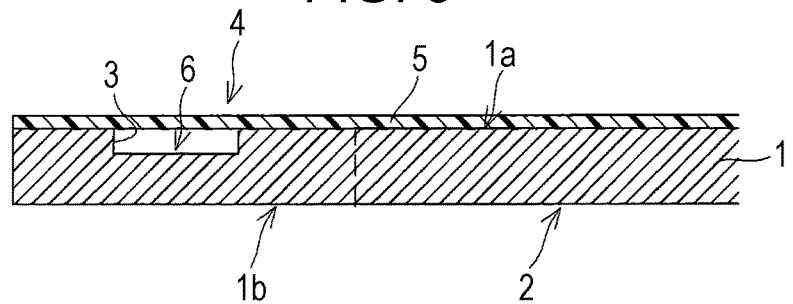
FIG. 3 is a sectional view explaining the peeling method of a cover member.

Next, as illustrated in FIG. 3, the cover member 5 is attached to the side of the one side surface 1a of the substrate 1 to cover the one side surface 1a. Here, the cover member 5 is a material for protecting the side of the one side surface 1a of the substrate 1 when processing the side of the other side surface 1b of the substrate 1. As the cover member 5, for example, a film member made of resin such as polyphenylene sulfide (PPS) or polyparaphenylene terephthalamide (PPTA) can be used. Of course, the cover member 5 is not limited to resin and it may be a material such as rubber or elastomer. In addition, the cover member 5 is required to be a material capable of protecting the substrate 1 and wiring or the like provided in the pattern region 2 of the substrate 1 when processing the other side surface 1b of the substrate 1. Furthermore, it is preferable that the cover member 5 be a flexible material. It is possible to easily peel off the cover member 5 from the substrate 1 in a later step by using the cover member made of such a flexible material. In addition, the method of attaching the cover member 5 to the substrate 1 is not particularly limited, and the cover member 5 may be adhered using adhesive or may be welded.

In addition, in the cover member attaching step, it is preferable that the substrate 1 be heated. As described above, the substrate 1 is heated so that in a step after the cover member attaching step, a temperature of the substrate 1 can be easily lowered more than the temperature of the substrate 1 in the cover member attaching step. Therefore, it is possible to suppress that the portion the cover member 5 of the opening region 4 of the substrate 1 unintentionally swells and to suppress the cover member 5 becomes an obstacle during the transportation of the substrate 1 or other processing. That is, it is preferable that the temperature of the substrate 1 in the cover member attaching step be higher than the temperature (room temperature) during the transportation and it is preferable that the temperature be 40° C. or more. In addition, in the embodiment, since the cover member 5 needs to be deformed in a convex shape on a side opposite to the recessed portion 3 by heating the substrate 1 in the later pressure adjusting step, it is preferable that the temperature of the substrate 1 in the cover member attaching step be a temperature lower than a heating temperature of the substrate 1 in the pressure adjusting step, for example, is 80° C. or lower.

As described above, after the cover member 5 is attached to the substrate 1, the side of the other side surface 1b that is the side opposite to the cover member 5 is processed. Here, processing on the side of the other side surface 1b of the substrate 1 also includes directly processing the side of the other side surface 1b of the substrate 1 and processing another substrate being in contact with the other side surface of the substrate 1. In the processing on the side of the other side surface 1b of the substrate 1, it is possible to protect the side of the one side surface 1a of the substrate 1 by the cover member 5.

Next, the pressure adjusting step for increasing a pressure within a space 6 formed by the recessed portion 3 and the cover member 5 to be higher than a pressure on the outside of the space 6, that is, on a side opposite to the space 6 with the cover member 5 interposed therebetween.

Figure 4:
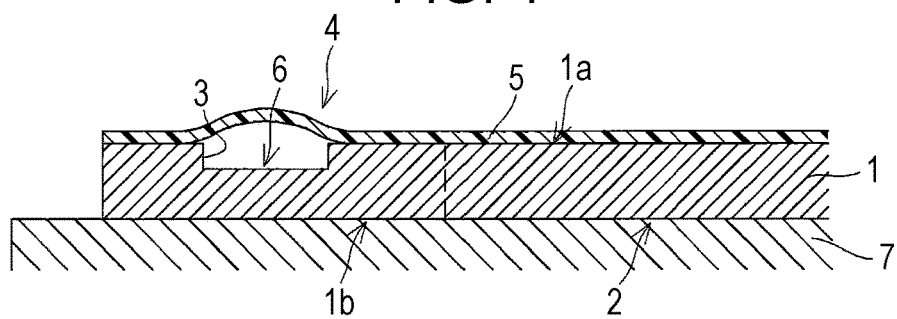
FIG. 4 is a sectional view explaining the peeling method of a cover member.

In the embodiment, as illustrated in FIG. 4, the substrate 1 is disposed on a table 7 so that the other side surface 1b is on a side of the table 7, and the substrate 1 is heated, and thereby gas within the space 6 is expanded and the pressure within the space 6 is higher than the pressure of the outside. Therefore, the gas within the space 6 pushes up the cover member 5 to the side opposite to the space 6 so that the expanded gas easily enters a joint interface between the substrate 1 and the cover member 5. Moreover, the substrate 1 is held on the table 7. Therefore, in the later cover member peeling step, the cover member 5 is pulled to the side opposite to the substrate 1 and the cover member 5 can be peeled off from the substrate 1. Moreover, a holding method of the substrate 1 on the table 7 is not particularly limited and an example thereof includes suction holding for sucking and holding the other side surface 1b of the substrate 1, pinching and holding the substrate 1 by a chuck, or the like. Destruction of the substrate 1 can be suppressed by sucking and holding the substrate 1 on the table 7 compared to a case where the substrate 1 is held by the chuck or the like. In addition, a heating method of the substrate 1 is not particularly limited and the substrate 1 may be heated by providing a heating unit such as an electric heater in the table 7, or the substrate 1 may be heated by irradiating with an infrared lamp or the like. In any case, the substrate 1 is heated so that the temperature of the gas within the space 6 may be higher than the temperature of the gas of outside of the space 6, that is, on the side opposite to the space 6 with the cover member 5 interposed therebetween. In the embodiment, the temperature of the substrate 1 in the pressure adjusting step is a temperature higher than the temperature of the substrate 1 in the cover member attaching step, for example, is higher than 80° C. Therefore, the cover member 5 is pushed up on the side opposite to the space 6 by the gas within the space 6 and the cover member 5 of the opening region 4 can be deformed so as to be convex on the side opposite to the substrate 1. That is, if the temperature of the substrate 1 of the pressure adjusting step is lower than the temperature of the substrate 1 of the cover member attaching step, the cover member 5 of the opening region 4 is deformed so as to protrude into the recessed portion 3 and stress is applied in a direction opposite to the direction of peeling off the cover member 5 from the substrate 1. In addition, the temperature of the substrate 1 in the pressure adjusting step is a temperature at which wiring or the like formed in the pattern region 2 of the substrate 1 is not influenced, and in the embodiment, is for example, 100° C.

Figure 5:
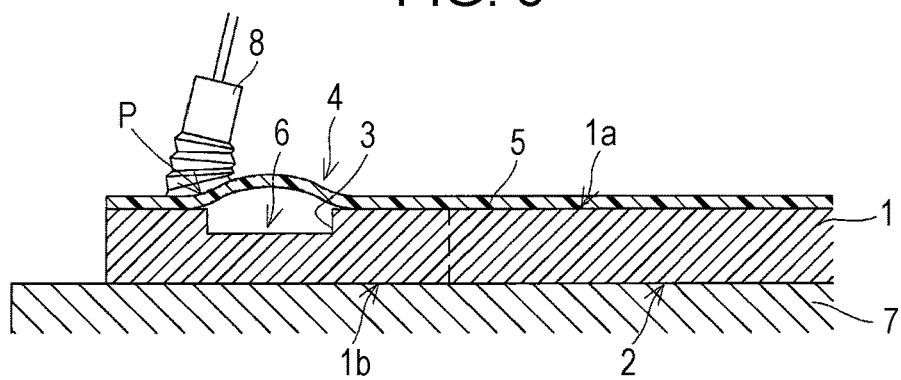
FIG. 5 is a sectional view explaining the peeling method of a cover member.
Figure 6:
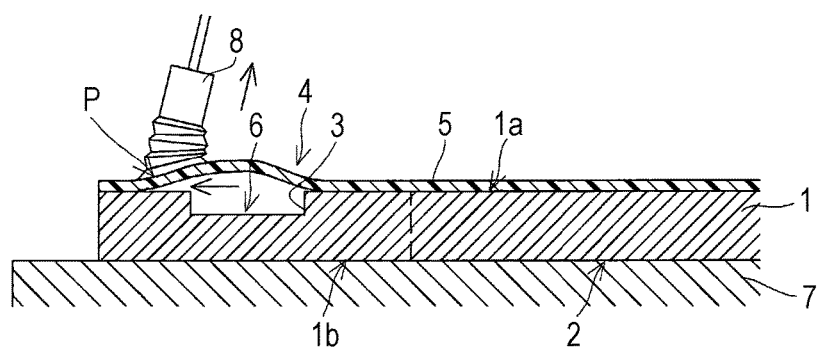
FIG. 6 is a sectional view explaining the peeling method of a cover member.

In such a state, as illustrated in FIG. 5, a surface of the cover member 5 on the side opposite to the substrate 1 is held by a holding member 8 and, as illustrated in FIG. 6, the cover member 5 is pulled by the holding member 8 in a direction away from the substrate 1, that is, in the direction opposite to the substrate 1. In the embodiment, the holding member 8 is used to suck and hold the surface of the cover member 5. As illustrated in FIG. 1, a region P in which the holding member 8 holds and pulls the cover member 5 is a surface of the cover member 5 on the side opposite to the substrate 1 when viewed in a plan view from a stacking direction of the cover member 5 and the substrate 1, and it is preferable that the region P be a region including at least a part of a region of the substrate 1 overlapping the opening region 4 of the substrate 1. That is, at least a part of the region P of the cover member 5 held by the holding member 8 may be overlapped with the opening of the recessed portion 3 on the one side surface 1a of the substrate 1. Such a region P of the cover member 5 is pulled on the side opposite to the substrate 1 by the holding member 8 so that the gas within the space 6 can effectively enter between the substrate 1 and the cover member 5 while applying the peeling stress of the cover member 5 to the substrate 1. Of course, the region P of the surface of the cover member 5 held by the holding member 8 may include the entire region of the substrate 1 overlapping with the opening region 4. In a case where the region where the holding member 8 pulls the cover member 5 does not include the region of the substrate 1 overlapping with the opening region 4, all of the stress that the holding member 8 pulls the cover member 5 is applied to the substrate 1 and destruction such as warpage or cracks of the substrate 1 is likely to occur. That is, the region P of the cover member 5 held by the holding member 8 overlaps at least a part of the opening of the recessed portion 3 on the one side surface 1a of the substrate 1 so that gas enters the joint interface between the substrate 1 and the cover member 5. Therefore, it is possible to reduce the stress by which the holding member 8 pulls the cover member 5 applied to the substrate 1, and it is possible to suppress destruction such as warpage and cracks of the substrate 1.

In addition, it is preferable that the region P where the holding member 8 pulls the cover member 5 include a portion adjacent to the opening region 4 in a region closer to the outer periphery side of the substrate 1 than the opening region 4 of the cover member 5 when viewed in a plan view from the stacking direction of the cover member 5 and the substrate 1. That is, it is preferable that the region where the holding member 8 pulls the cover member 5 straddle the opening region 4 of the substrate 1 and the portion adjacent to the outer periphery side close to the opening region 4. Therefore, the gas within the space 6 can effectively enter the outer periphery side of the opening region 4 of the joint interface between the substrate 1 and the cover member 5.

Moreover, pulling the cover member 5 by the holding member 8 on the side opposite to the substrate 1 means that the holding member 8 pulls the cover member 5 in a direction having a vector in the stacking direction of the substrate 1 and the cover member 5. That is, the pulling also includes that the holding member 8 pulls the cover member 5 in a direction inclined with respect to the stacking direction of the substrate 1 and the cover member 5. However, it is preferable that the direction in which the holding member 8 pulls the cover member 5 include a vector in the direction opposite to the direction toward the outer periphery closest to the opening region 4 in a plane of the one side surface 1a of the substrate 1. That is, it is preferable that the direction in which the holding member 8 pulls the cover member 5 be an inclined direction including both of a vector including the direction opposite to the substrate 1 in the stacking direction of the cover member 5 and the substrate 1 and a vector in a direction opposite to the direction toward the outer periphery closest to the opening region 4 in a plane of the one side surface 1a of the substrate 1. Therefore, the gas within the space 6 can enter the outer periphery side from the opening region 4 between the substrate 1 and the cover member 5, and it is possible to easily peel off the cover member 5 from the substrate 1.

Figure 7:
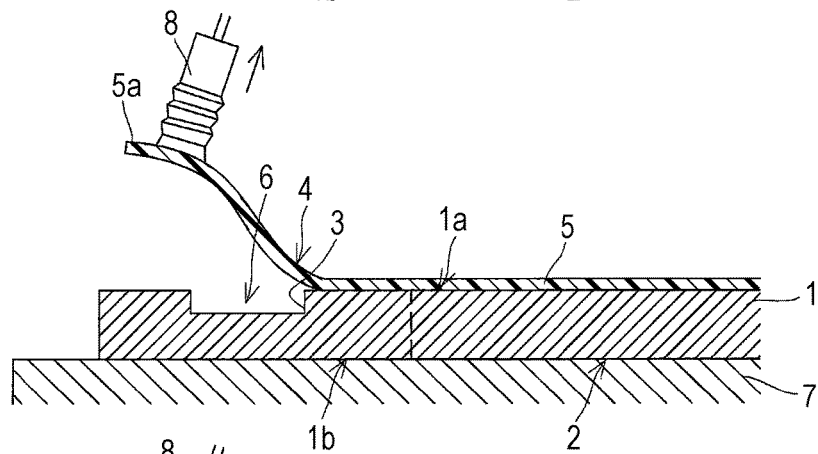
FIG. 7 is a sectional view explaining the peeling method of a cover member.

As illustrated in FIG. 7, the holding member 8 further pulls the cover member 5 in the direction opposite to the substrate 1 so that the gas within the space 6 is moved to the outer periphery of the joint interface between the substrate 1 and the cover member 5 (gas moving step). Therefore, an end portion 5a of the cover member 5 is peeled off from the substrate 1 on the outer periphery side of the substrate 1.

Next, the end portion 5a of the cover member 5 peeled off from the substrate 1 by the gas moved in the gas moving step is pinched and peeled off (pinched and peeled off step).

Figure 8:
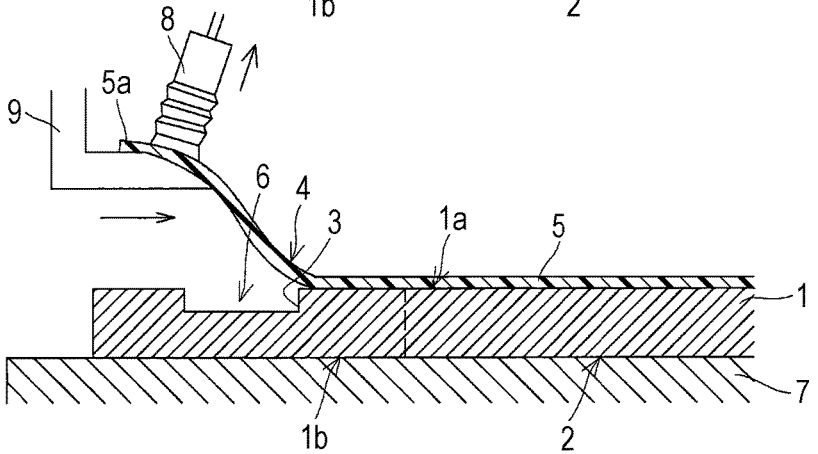
FIG. 8 is a sectional view explaining the peeling method of a cover member.

Specifically, as illustrated in FIG. 8, the end portion 5a of the cover member 5 peeled off from the substrate 1 by the gas moved in the gas moving step is pinched between the holding member 8 and a support member 9.

Figure 9:
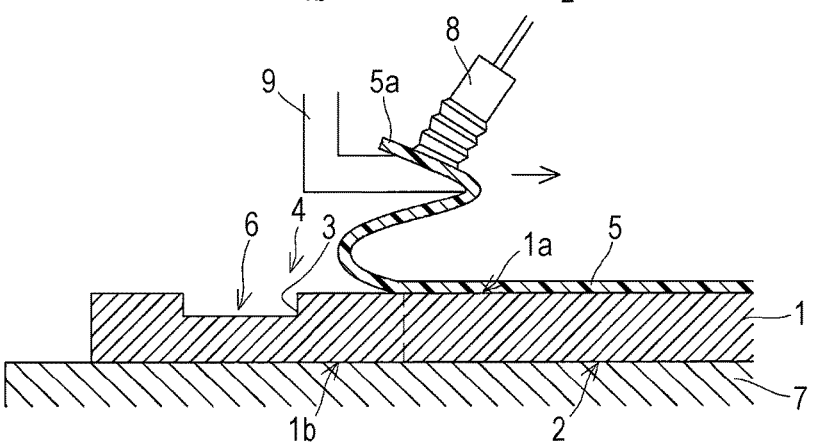
FIG. 9 is a sectional view explaining the peeling method of a cover member.

Next, as illustrated in FIG. 9, in a state where the end portion 5a of the cover member 5 is pinched between the holding member 8 and the support member 9, the cover member 5 is peeled off from the substrate 1 by moving the holding member 8 and the support member 9. Moreover, it is preferable that a moving direction of the holding member 8 and the support member 9 be a direction that is on a center line passing through a center of the pinched end portion 5a of the cover member 5 and the substrate 1, and in a direction opposite to the pinched end portion 5a. Therefore, twisting generated in the cover member 5 when the cover member 5 is pulled is suppressed, application of the stress to the substrate 1 in a twisting direction can be suppressed, and destruction such as warpage or cracks of the substrate 1 can be suppressed. Moreover, in the embodiment, the end portion 5a of the cover member 5 peeled off from the substrate 1 is pinched between the holding member 8 and the support member 9, but if the holding member 8 holds the cover member 5 with a force which is sufficiently strong, the support member 9 may not be provided.

As described above, in the embodiment, the opening region forming step, in which the recessed portion 3 opening to the one side surface 1a of the substrate 1 is formed the region other than the pattern region 2 of the substrate 1 and the opening region 4 including the opening of the recessed portion 3 is formed on the one side surface 1a of the substrate 1, is performed, and then the cover member attaching step, in which the cover member 5 is attached so as to cover the one side surface 1a of the substrate 1, is performed. Next, the pressure adjusting step, in which the pressure within the space 6 formed by the recessed portion 3 and the cover member 5 is increased by attaching the cover member 5 to the substrate 1 to be higher than the pressure on the side opposite to the space 6 with the cover member 5 interposed therebetween, is performed, and then the cover member peeling step, in which the cover member 5 is peeled off from the substrate 1 in the cover member attaching step, in a state where the pressure within the space 6 is increased by the pressure adjusting step, and thereby the cover member 5 is peeled off from the substrate 1. Therefore, when the cover member 5 is peeled off, even if the peeling force is weak, the cover member 5 can be reliably peeled off. Therefore, it is possible to suppress peeling failure of the cover member 5 due to weak force for peeling the cover member 5 and it is possible to suppress generation of warpage of the substrate 1 or destruction such as cracks caused by the warpage by strong force for peeling the cover member 5 and application of excessive stress to the substrate 1. That is, in the peeling off of the cover member 5 from the substrate 1 without providing the recessed portion 3 and the opening region 4 on the outside of the pattern region 2 of the substrate 1, if the peeling force is weak, peeling cannot be performed, if the peeling force is strong, the adhesive force between the cover member 5 and the substrate 1 is high, the cover member 5 is not peeled off from the substrate 1, and destruction such as warpage or cracks is generated in the substrate 1. In addition, when the cover member 5 is peeled off from the substrate 1, even if the substrate 1 is heated without providing the recessed portion 3 and the opening region 4 in the substrate 1, the cover member 5 cannot be satisfactorily peeled off from the substrate 1. For example, even if the substrate 1 is heated to a temperature higher than the temperature of the substrate 1 in the pressure adjusting step of the embodiment, for example, substantially 150° C., the cover member 5 cannot be peeled off from the substrate 1, or the warpage is generated in the substrate 1 even if the peeling off can be performed. Therefore, destruction such as cracks is generated in the substrate 1. In the embodiment, instead of heating the substrate 1 for the purpose of lowering adhesiveness of the cover member 5, since the substrate 1 is heated for the purpose of expanding the gas within the space 6, the substrate 1 may not be heated to a high temperature at which adhesiveness of the cover member 5 decreases. Therefore, it is possible to reduce the adverse influence of heating on the substrate 1, the wiring of the pattern region 2, or the like.

In addition, in the embodiment, in the pressure adjusting step in which the pressure within the space 6 is increased, the gas within the space 6 is expanded by heating the substrate 1 so as to increase the pressure. That is, the temperature of the substrate 1 in the pressure adjusting step is higher than the temperature of the substrate 1 in the cover member attaching step. As described above, since the pressure within the space 6 can be increased by a simple method of heating the substrate 1, a large-scaled device is not necessary and cost can be reduced.

Moreover, it is preferable that the temperature of the substrate 1 after the cover member attaching step to the pressure adjusting step be lower than the temperature of the substrate 1 of the cover member attaching step. That is, it is possible to suppress unintentional swelling of the cover member 5 and destruction of the cover member 5 during transportation or the like by lowering the temperature of the substrate 1 in the processing step of the side of the other side surface 1b of the substrate 1, during transportation of the substrate 1, or the like.

Figure 10:
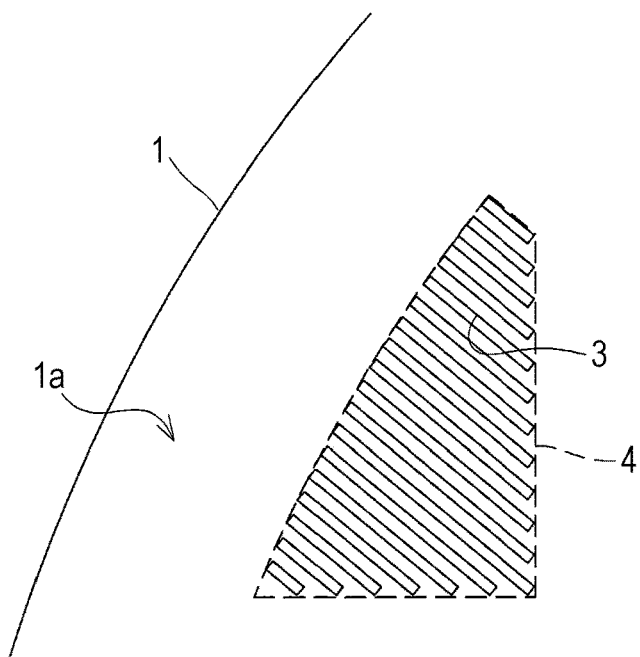
FIG. 10 is a plan view of a main portion illustrating a modification example of an opening region.
Figure 11:
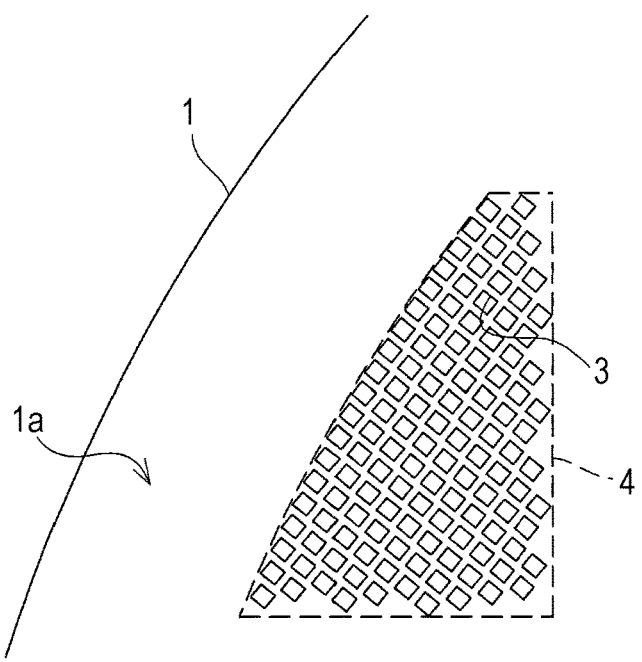
FIG. 11 is a plan view of a main portion illustrating a modification example of an opening region.

In addition, in the above-described example, only one recessed portion 3 is provided, but is not particularly limited. Here, other examples of the opening region are illustrated in FIGS. 10 and 11. Moreover, FIGS. 10 and 11 are plan views illustrating modification examples of the opening region according to Embodiment 1 of the invention.

As illustrated in FIG. 10, a plurality of groove-shaped recessed portions 3 are juxtaposed in an extension direction of the recessed portions 3, and the opening region 4 may be formed by openings of the plurality of the recessed portions 3. Moreover, it is preferable that the extension direction of the recessed portions 3 be a peeling direction of peeling the cover member 5 from the substrate 1, that is, the moving direction of the holding member 8 and the support member 9. That is, it is preferable that a beam-like portion between the juxtaposed recessed portions 3 be extended in the peeling direction of the cover member 5. Therefore, it easier to peel off the cover member 5 when the cover member 5 is peeled off from the substrate 1. Moreover, the extension direction of the recessed portions 3 may not completely coincide with the peeling direction of the cover member 5 due to restrictions such as the crystal orientation of the substrate 1. In this case, it is preferable to make the extension direction of the recessed portions 3 as close as possible to the peeling direction of the cover member 5.

In addition, as illustrated in FIG. 11, a plurality of columns in which the plurality of the recessed portions 3 are juxtaposed may be disposed in a direction intersecting the juxtaposing direction of the recessed portions 3. That is, the recessed portions 3 may be disposed in a matrix. As described above, deflection of the cover member 5 is suppressed, the cover member 5 can be reliably deformed so as to be convex on the side opposite to the recessed portion 3 when the air pressure within the space 6 is increased in the pressure adjusting step, and the cover member 5 can be easily peeled off from the substrate 1 by the cover member peeling step by providing the plurality of the recessed portions 3.

Here, an ink jet type recording head that is an example of the liquid ejecting head of the embodiment, and a manufacturing method of the liquid ejecting head will be described.

Figure 12:
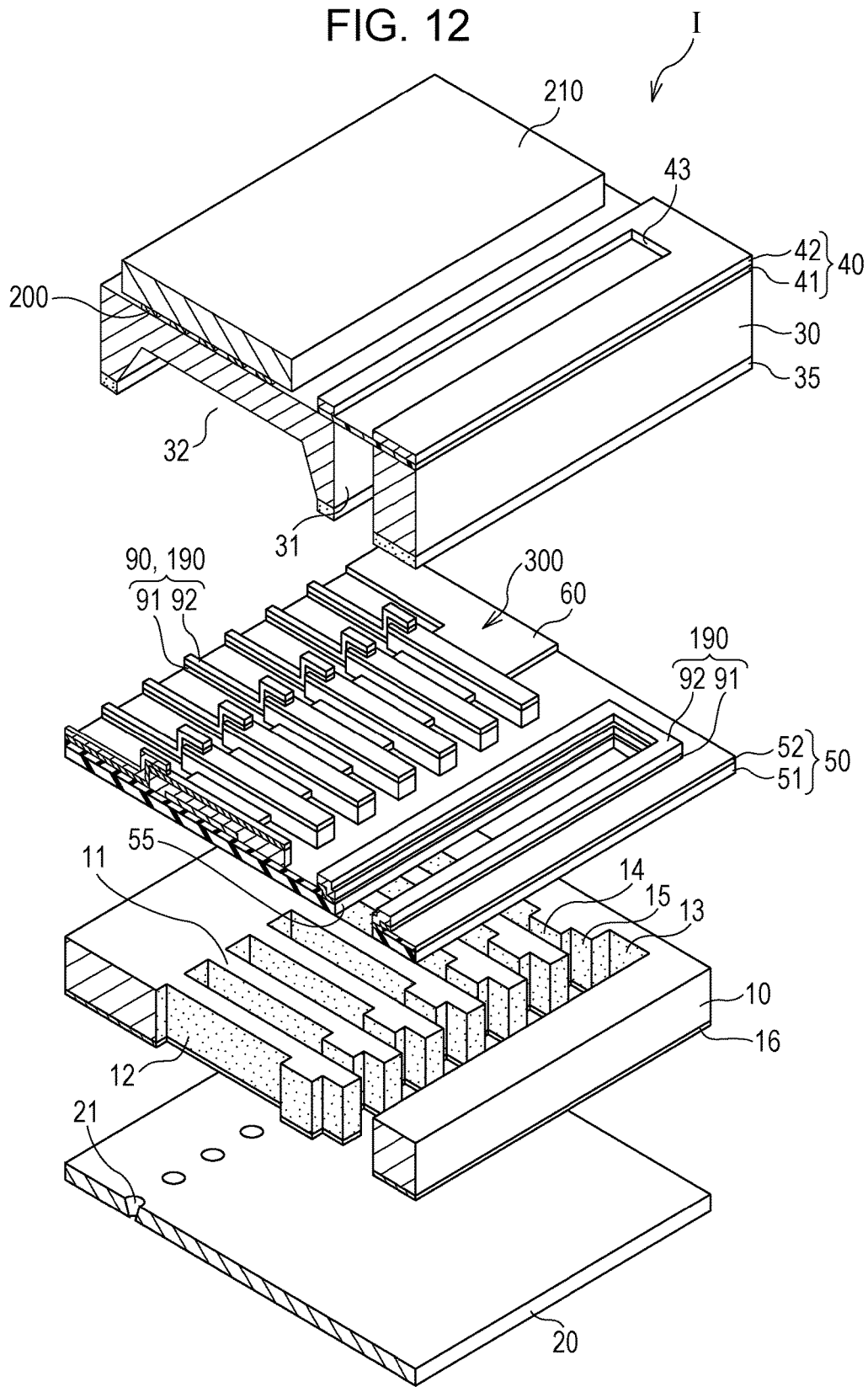
FIG. 12 is an exploded perspective view of a recording head.
Figure 13:
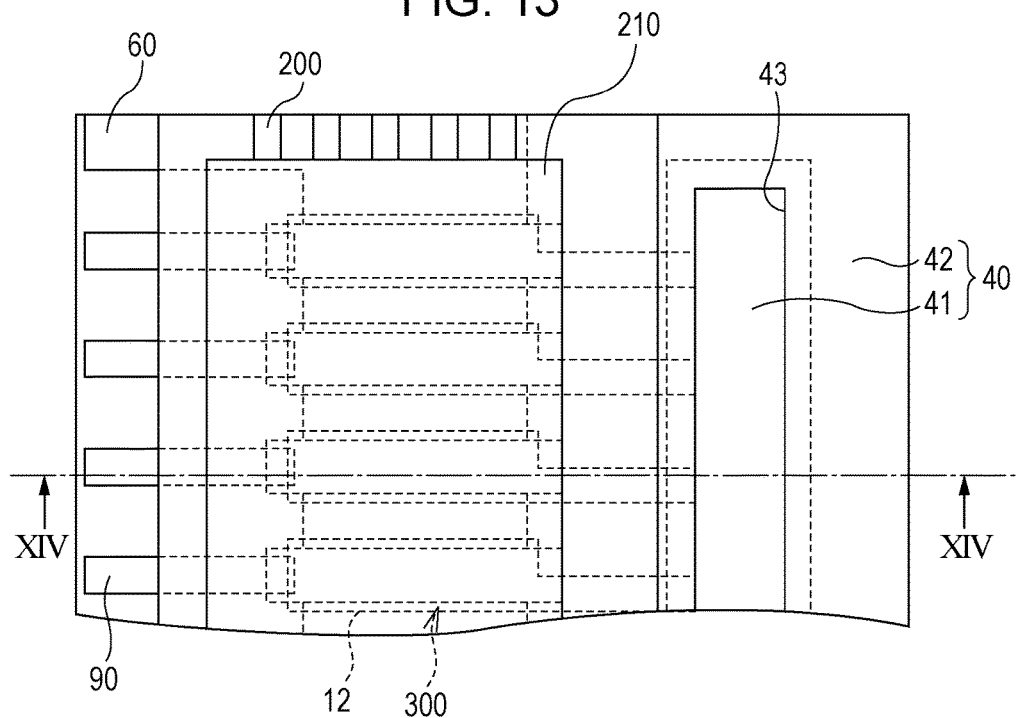
FIG. 13 is a plan view of the recording head.
Figure 14:
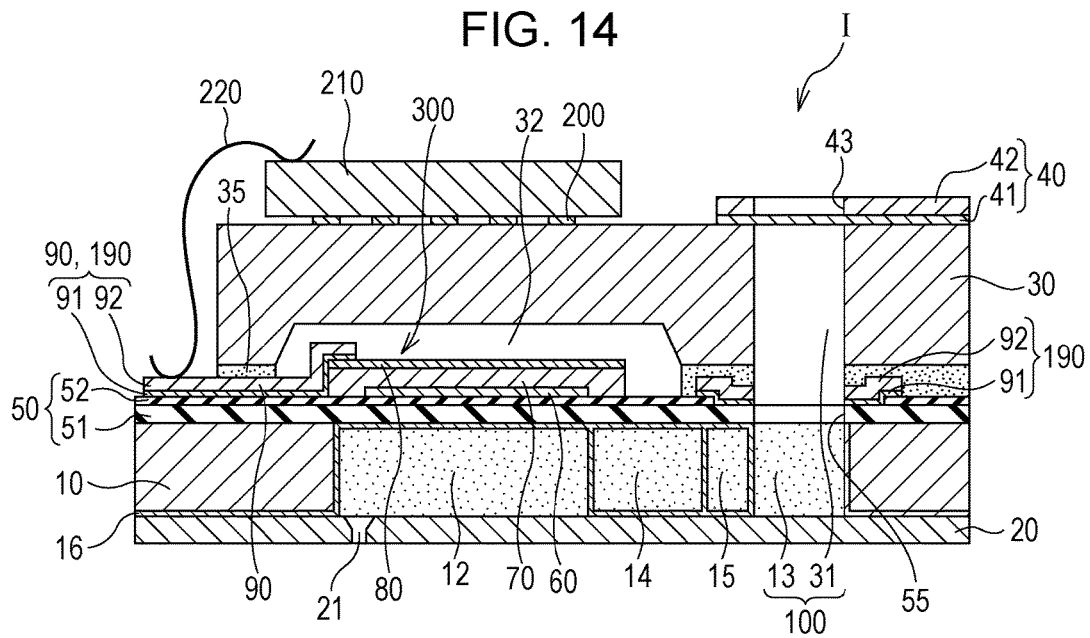
FIG. 14 is a sectional view of the recording head.

FIG. 12 is an exploded perspective view illustrating the ink jet type recording head manufactured by the manufacturing method according to Embodiment 1 of the invention, FIG. 13 is a plan view of the ink jet type recording head, and FIG. 14 is a sectional view that is taken along line XIV of FIG. 13.

As illustrated in the drawings, a flow path forming substrate 10 configuring an ink jet type recording head I is made of a silicon single crystal substrate having a plane orientation (110) in the embodiment, and pressure generating chambers 12, which are partitioned by a plurality of partition walls 11 by anisotropic etching from one side surface, are juxtaposed along a direction in which a plurality of nozzle openings 21 ejecting ink are juxtaposed. In addition, an ink supply path 14 and a communication path 15 are partitioned by the partition wall 11 on one end side of the pressure generating chamber 12. In addition, a communication portion 13 configuring a part of a manifold 100, which is a common liquid chamber of each of the pressure generating chambers 12, is formed on one end of the communication path 15. That is, the flow path forming substrate 10 is provided with a liquid flowing path configured of the pressure generating chamber 12, the communication portion 13, the ink supply path 14, and the communication path 15.

The ink supply path 14 is formed with a width narrower than that of the pressure generating chamber 12 and maintains a flow path resistance of the ink flowing from the communication portion 13 into the pressure generating chamber 12 to be constant.

Here, a protective film 16 made of a material having ink resistance properties, for example, tantalum oxide such as tantalum pentoxide ($Ta_2O_5$) is provided on inner wall surfaces of the pressure generating chamber 12, the communication portion 13, the ink supply path 14, and the communication path 15 of the flow path forming substrate 10 with a thickness of substantially 50 nm. Moreover, the ink resistance properties referred to here is etching resistance properties with respect to an alkaline ink. In addition, in the embodiment, a surface of the flow path forming substrate 10 on a side on which the pressure generating chamber 12 or the like opens, that is, a joining surface to which a nozzle plate 20 is joined is also provided with the protective film 16. Of course, since the ink is not substantially in contact with such a region, the protective film 16 may not be provided.

Moreover, the material of such a protective film 16 is not limited to tantalum oxide, and may use, for example, zirconium oxide ($ZrO_2$), nickel (Ni), chromium (Cr) or the like depending on the pH value of the ink used.

The nozzle plate 20 in which the nozzle openings 21, which communicate with the vicinity of an end portion of each of the pressure generating chambers 12 on the side opposite to the ink supply path 14, are bored is fixed to the surface side of the flow path forming substrate 10 on which the protective film 16 is formed. Moreover the nozzle plate 20 is made of glass ceramics having a thickness of, for example, 0.01 to 1 mm and a linear expansion coefficient of, for example, 2.5 to 4.5 [$\times 10^{-6}/°$ C.] at 300° C. or less, silicon single crystal substrate, stainless steel, or the like.

On the other hand, a vibration plate 50 is formed on a surface of the flow path forming substrate 10 on the side opposite to the nozzle plate 20. In the embodiment, the vibration plate 50 is provided with an elastic film 51 provided on the flow path forming substrate 10 side and made of silicon oxide, and an insulating film 52 provided on the elastic film 51 and made of zirconium oxide. Moreover, the liquid flowing path such as the pressure generating chamber 12 is formed by anisotropically etching the flow path forming substrate 10 from the surface side to which the nozzle plate 20 is joined, and the surface of the pressure generating chamber 12 on the side opposite to the nozzle plate 20 is defined by the elastic film 51.

In addition, a first electrode 60, a piezoelectric layer 70, and a second electrode 80 are stacked by a film formation and lithography method which are described later in detail to configure a piezoelectric actuator 300 on the vibration plate 50 of the flow path forming substrate 10. In the embodiment, the piezoelectric actuator 300 is a pressure generating unit that generates a pressure change in the ink within the pressure generating chamber 12. Here, the piezoelectric actuator 300 is also referred to as piezoelectric element and is a portion including the first electrode 60, the piezoelectric layer 70, and the second electrode 80. In general, one of electrodes of the piezoelectric actuator 300 is used as a common electrode common to a plurality of the piezoelectric actuators 300 and the other electrode is configured as an industrial electrode independent for each of the piezoelectric actuators 300. In the embodiment, the first electrode 60 is used as the common electrode and the second electrode 80 is used as the industrial electrode, but this may be reversed. Moreover, in the above-described example, the vibration plate 50 and the first electrode 60 act as the vibration plate, but it is of course not limited thereto, and for example, only the first electrode 60 may act as the vibration plate without providing the vibration plate 50. In addition, the piezoelectric actuator 300 itself may also substantially function as a vibration plate.

In addition, lead electrodes 90 configured of a wiring layer 190 formed of an adhesion layer 91 and a metal layer 92 are respectively connected to the second electrode 80 of the piezoelectric actuator 300, and a voltage is selectively applied to each of the piezoelectric actuators 300 via the lead electrode 90. In addition, as will be described in detail later, the wiring layer 190, which is configured of the adhesion layer 91 and the metal layer 92 but is discontinuous with the lead electrode 90, is present on the vibration plate of a region corresponding to a peripheral edge portion of the opening of the communication portion 13, that is, on the vibration plate 50.

Furthermore, a protective substrate 30 including a manifold portion 31 which configures at least a part of the manifold 100 is joined to a surface of the flow path forming substrate 10 on a side of the piezoelectric actuator 300. In the embodiment, the flow path forming substrate 10 and the protective substrate 30 are joined using an adhesive 35. The manifold portion 31 of the protective substrate 30 communicates with the communication portion 13 via a penetrating portion 55 which is provided in the elastic film 51 and the insulating film 52, and the manifold 100 is formed by the manifold portion 31 and the communication portion 13.

In addition, a piezoelectric element holding portion 32 is provided in a region of the protective substrate 30 facing the piezoelectric actuator 300. Since the piezoelectric actuator 300 is formed within the piezoelectric element holding portion 32, the piezoelectric actuator 300 is protected under almost no influence of the external environment. Moreover, the piezoelectric element holding portion 32 may be sealed or may not be sealed.

As a material of such a protective substrate 30, for example, glass, a ceramic material, metal, resin, or the like can be cited, but it is preferable that it be formed of a material having substantially the same thermal expansion coefficient as that of the flow path forming substrate 10, and in the embodiment, the protective substrate 30 is formed by using the silicon single crystal substrate that is the same material as the flow path forming substrate 10.

In addition, a connection wiring 200 is formed in a predetermined pattern is provided on the protective substrate 30 and a driving IC 210 for driving the piezoelectric actuator 300 is mounted on the connection wiring 200. A tip end portion of each of the lead electrodes 90 drawn out from each of the piezoelectric actuators 300 to the outside of the piezoelectric element holding portion 32 and the driving IC 210 are electrically connected via a drive wiring 220.

Furthermore, a compliance substrate 40 configured of a sealing film 41 and a fixing plate 42 is joined to a region of the protective substrate 30 corresponding to the manifold portion 31. The sealing film 41 is made of a material having low rigidity and flexibility (for example, polyphenylene sulfide (PPS) film having a thickness of 6 μm), and one side surface of the manifold portion 31 is sealed by the sealing film 41. In addition, the fixing plate 42 is formed of a hard material such as metal (for example, stainless steel (SUS) having a thickness of 30 μm or the like). Since a region of the fixing plate 42 facing the manifold 100 is an opening portion 43 which is completely removed in the thickness direction, one side surface of the manifold 100 is sealed only by the sealing film 41 having flexibility.

In the ink jet type recording head I of the embodiment, the ink is taken in from an external ink supply unit (not illustrated), an inside from the manifold 100 to the nozzle opening 21 is filled with the ink, and then a voltage is applied between the first electrode 60 and the second electrode 80 respectively corresponding to the pressure generating chamber 12 according to a recording signal from the driving IC 210, the piezoelectric actuator 300 and the vibration plate 50 are bent and deformed, so that a pressure within each of the pressure generating chambers 12 is increased and the ink is ejected from the nozzle opening 21.

Hereinafter, a manufacturing method of the ink jet type recording head will be described with reference to FIGS. 15 to 29. Moreover, FIGS. 15 to 29 are sectional views illustrating the manufacturing method of the ink jet type recording head.

Figure 15:
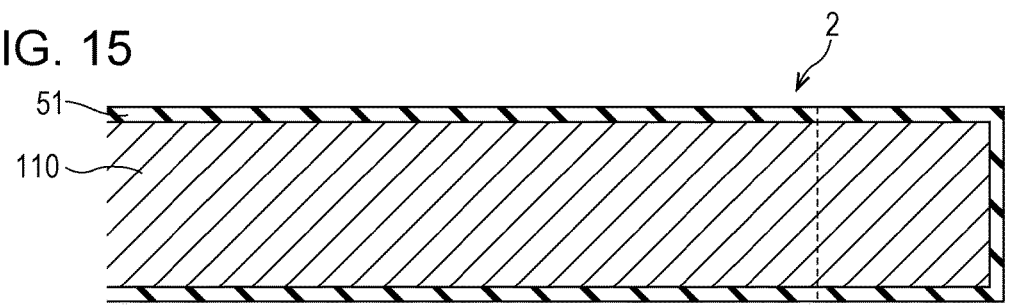
FIG. 15 is a sectional view explaining a manufacturing method of a recording head.

First, as illustrated in FIG. 15, a flow path forming substrate wafer 110 that is a silicon wafer on which a plurality of the flow path forming substrates 10 are formed is thermally oxidized in a diffusion furnace at substantially 1100° C. and the elastic film 51 is formed on the surface thereof.

Figure 16:
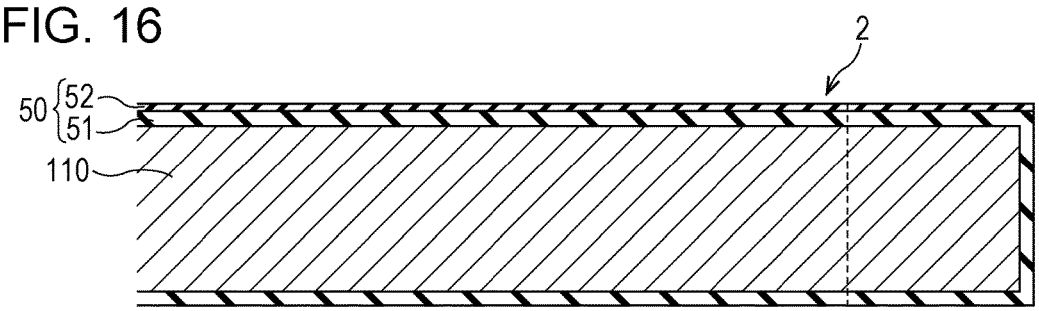
FIG. 16 is a sectional view explaining the manufacturing method of a recording head.

Next, as illustrated in FIG. 16, the insulating film 52 made of zirconium oxide is formed on the elastic film 51. Specifically, a zirconium (Zr) layer is formed on the elastic film 51 by, for example, sputtering, or the like, and then the zirconium layer is thermally oxidized in a diffusion furnace at, for example, 500 to 1200° C. to form the insulating film 52 made of zirconium oxide ($ZrO_2$), and the vibration plate 50 made of the elastic film 51 and the insulating film 52 is formed.

Figure 17:
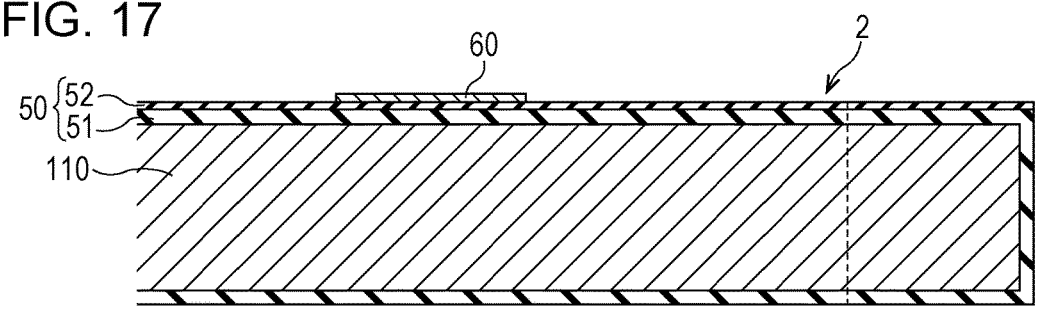
FIG. 17 is a sectional view explaining the manufacturing method of a recording head.
Figure 18:
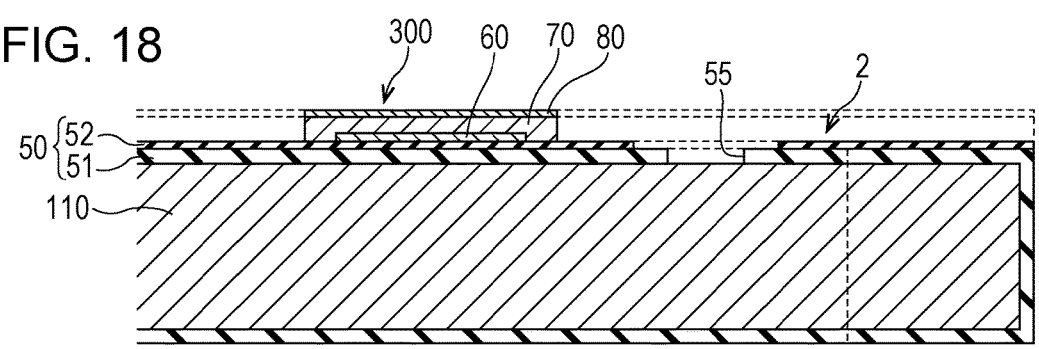
FIG. 18 is a sectional view explaining the manufacturing method of a recording head.

Next, as illustrated in FIG. 17, for example, platinum and iridium are stacked on the insulating film 52 to form the first electrode 60 and then the first electrode 60 is patterned into a predetermined shape. Next, as illustrated in FIG. 18, for example, the piezoelectric layer 70 made of, for example, lead zirconate titanate (PZT) or the like, and the second electrode 80 made of, for example, iridium are formed on an entire surface of the flow path forming substrate wafer 110, and the piezoelectric layer 70 and the second electrode 80 are patterned on a region facing each of the pressure generating chambers 12 to form the piezoelectric actuator 300. In addition, after the piezoelectric actuator 300 is formed, the penetrating portion 55, which penetrates the insulating film 52 and the elastic film 51, and exposes the surface of the flow path forming substrate wafer 110, is formed in a region in which the communication portion 13 (not illustrated) of the flow path forming substrate wafer 110 by patterning the insulating film 52 and the elastic film 51.

The piezoelectric layer 70 is made of an oxide piezoelectric material having a polarized structure formed on the first electrode 60 and, for example, a perovskite type oxide represented by a general formula $ABO_3$ can be used. As the material of the piezoelectric layer 70, a ferroelectric piezoelectric material such as lead zirconate titanate (PZT), a lead-based piezoelectric material containing lead such as a relaxor ferroelectric added with metal such as niobium, nickel, magnesium, bismuth, yttrium, or the like, a lead-free piezoelectric material including no lead, and the like can be exemplified.

In addition, a forming method of the piezoelectric layer 70 is not particularly limited and, for example, in the embodiment, the piezoelectric layer 70 is formed by using a so-called sol-gel method by which the piezoelectric layer 70 made of metal oxide is obtained by applying and drying a so-called sol which is obtained by dissolving and dispersing a metal organic material in a catalyst, and further firing the sol at a high temperature. Moreover, the forming method of the piezoelectric layer 70 is not particularly limited and, for example, a MOD method, a sputtering method, or the like may be used.

Figure 19:
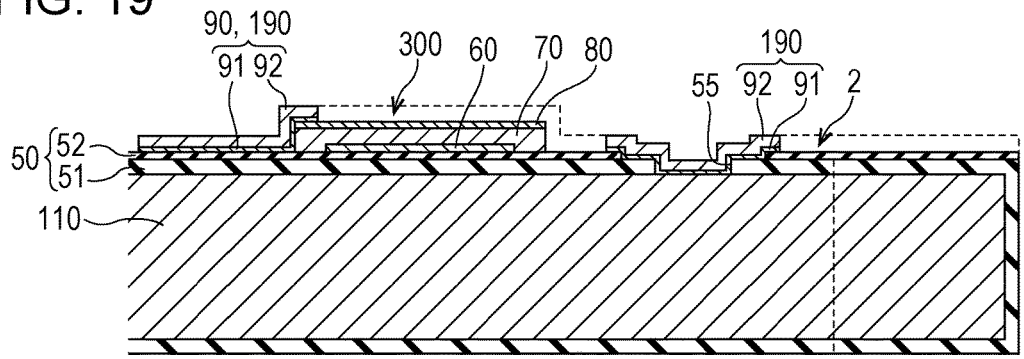
FIG. 19 is a sectional view explaining the manufacturing method of a recording head.

Next, as illustrated in FIG. 19, the lead electrode 90 is formed. Specifically, first, the metal layer 92 is formed over an entire surface of the flow path forming substrate wafer 110 via the adhesion layer 91 and the wiring layer 190 made of the adhesion layer 91 and the metal layer 92 is formed. A mask pattern (not illustrated) made of, for example, a resist or the like is formed on the wiring layer 190 and the metal layer 92 and the adhesion layer 91 are patterned for each piezoelectric actuator 300 via the mask pattern to form the lead electrode 90. In this case, the wiring layer 190 which is discontinuous with the lead electrode 90 leaves in a region facing the penetrating portion 55 and the penetrating portion 55 is sealed by the wiring layer 190.

Here, a main material of the metal layer 92 is not particularly limited as long as it is a material having a relatively high conductivity and, for example, gold (Au), aluminum (Al), and copper (Cu) can be exemplified, and in the embodiment, gold (Au) is used. In addition, the material of the adhesion layer 91 may be any material as long as adhesion of the metal layer 92 can be secured. Specifically, titanium (Ti), titanium tungsten compound (TiW), nickel (Ni), chromium (Cr) or a nickel chromium compound (NiCr), and the like can be exemplified. In the embodiment, a titanium tungsten compound (TiW) is used.

Figure 20:
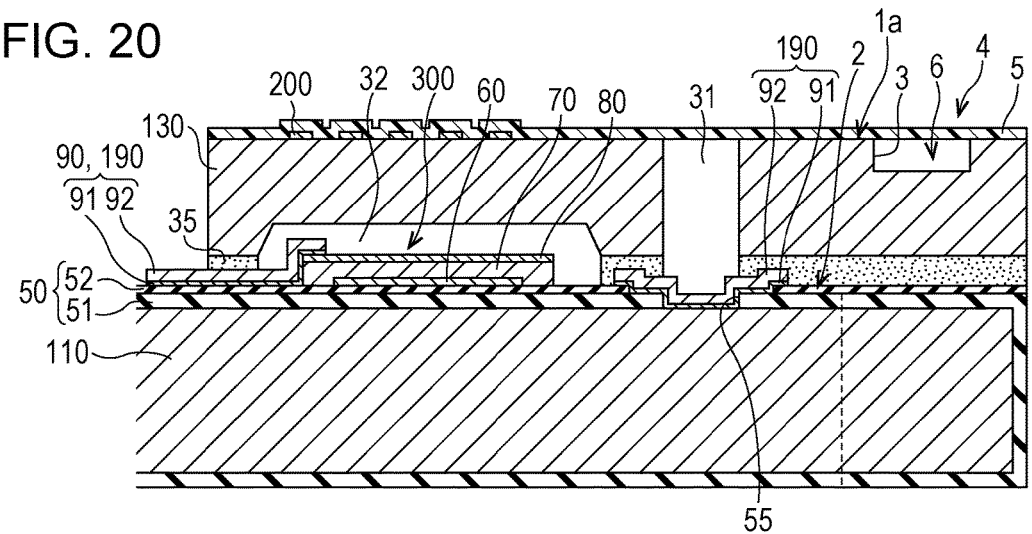
FIG. 20 is a sectional view explaining the manufacturing method of a recording head.

Next, as illustrated in FIG. 20, a protective substrate wafer 130 is bonded on the flow path forming substrate wafer 110 by the adhesive 35. Here, the manifold portion 31, the piezoelectric element holding portion 32, the connection wiring 200, and the like are formed in a portion to be the pattern region 2 of the protective substrate wafer 130 in advance. In addition, the recessed portion 3, which opens to the surface opposite to the surface joined to the flow path forming substrate wafer 110 in advance, is formed on the outside of the pattern region 2. Moreover, the recessed portion 3 may be formed, for example, at the same time when the manifold portion 31, the piezoelectric element holding portion 32, or the like is formed in the protective substrate wafer 130. Therefore, a step of newly forming the recessed portion 3 becomes unnecessary and the cost can be reduced.

The cover member 5 is attached to the surface of the protective substrate wafer 130 opposite to the flow path forming substrate wafer 110. Attachment of the cover member 5 to the protective substrate wafer 130 may be performed after the flow path forming substrate wafer 110 and the protective substrate wafer 130 are bonded by the adhesive 35. However, also in order to protect the protective substrate wafer 130 itself or the connection wiring 200, it is preferable that the attachment of the cover member 5 be performed before the flow path forming substrate wafer 110 and the protective substrate wafer 130 are bonded.

A material of the cover member 5 is not particularly limited as long as it is a material which is resistant to an alkali solution used when anisotropically etching the flow path forming substrate wafer 110, a material which is resistant to an etching liquid used when etching a peeling layer 17 (see FIG. 26) that is a titanium tungsten compound to be used for peeling the adhesion layer 91 of the wiring layer 190, and a material which is resistant to an etching liquid used when etching the metal layer 92 of the wiring layer 190 at a later step. For example, polyphenylene sulfide (PPS), polyparaphenylene terephthalamide (PPTA), or the like can be used.

Figure 21:
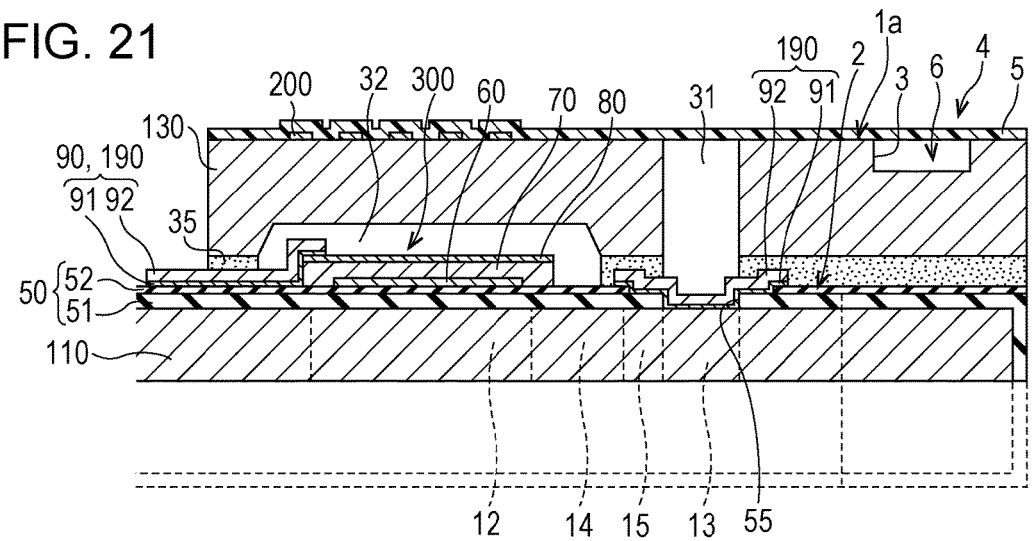
FIG. 21 is a sectional view explaining the manufacturing method of a recording head.
Figure 22:
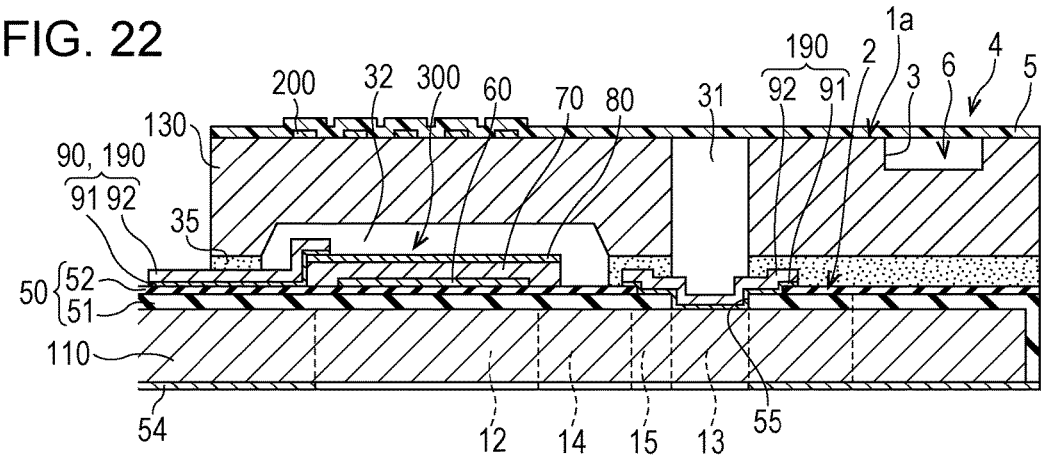
FIG. 22 is a sectional view explaining the manufacturing method of a recording head.

Next, as illustrated in FIG. 21, the surface of the flow path forming substrate wafer 110 opposite to the protective substrate wafer 130 is processed so that the flow path forming substrate wafer 110 has a predetermined thickness. Next, as illustrated in FIG. 22, a mask film 54 made of, for example, silicon nitride (SiN) is newly formed on the flow path forming substrate wafer 110 and is patterned into a predetermined shape.

Figure 23:
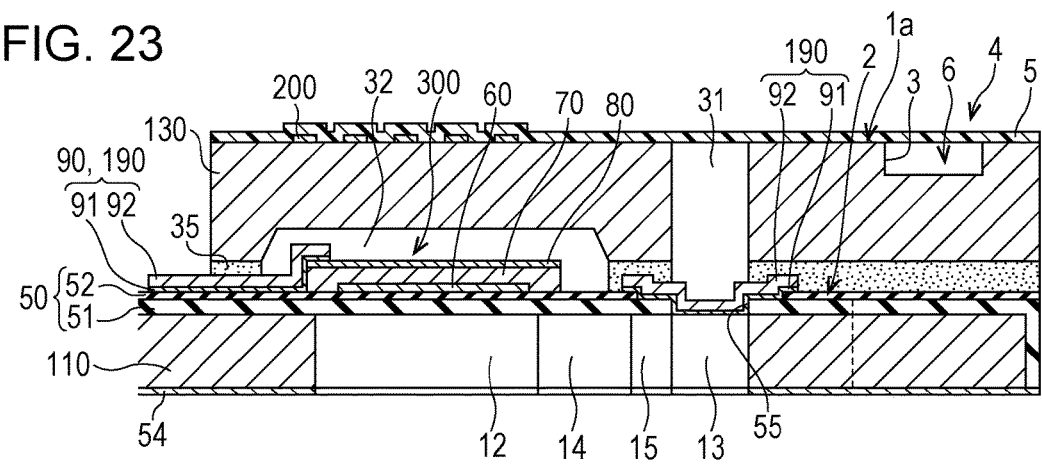
FIG. 23 is a sectional view explaining the manufacturing method of a recording head.

As illustrated in FIG. 23, the flow path forming substrate wafer 110 is anisotropically etched (wet etched) via the mask film 54 and the liquid flow path, in the embodiment, the pressure generating chamber 12, the communication portion 13, the ink supply path 14, the communication path 15, and the like are formed on the flow path forming substrate wafer 110. Specifically, the flow path forming substrate wafer 110 is etched, for example, by an etching liquid such as potassium hydroxide (KOH) aqueous solution until the elastic film 51 and the adhesion layer 91 (metal layer 92) are exposed to simultaneously form the pressure generating chamber 12, the communication portion 13, the ink supply path 14, and the communication path 15.

In addition, as described above, when the communication portion 13 and the like is formed, the penetrating portion 55 is sealed by the wiring layer 190 made of the adhesion layer 91 and the metal layer 92. Therefore, the etching liquid does not flow into the protective substrate wafer 130 side via the penetrating portion 55. Therefore, it is possible to prevent the protective substrate wafer 130 from being etched by entering of the etching liquid into the manifold portion 31 of the protective substrate wafer 130. In addition, even if the etching liquid flows from the outer periphery side of the flow path forming substrate wafer 110 and the protective substrate wafer 130 to the connection wiring 200 side of the protective substrate wafer 130, the surface of the protective substrate wafer 130 on the connection wiring 200 side is covered by the cover member 5. Therefore, attachment of the etching liquid to the connection wiring 200 is reliably prevented so that it is possible to prevent occurrence of failure such as disconnection of the connection wiring 200.

Figure 24:
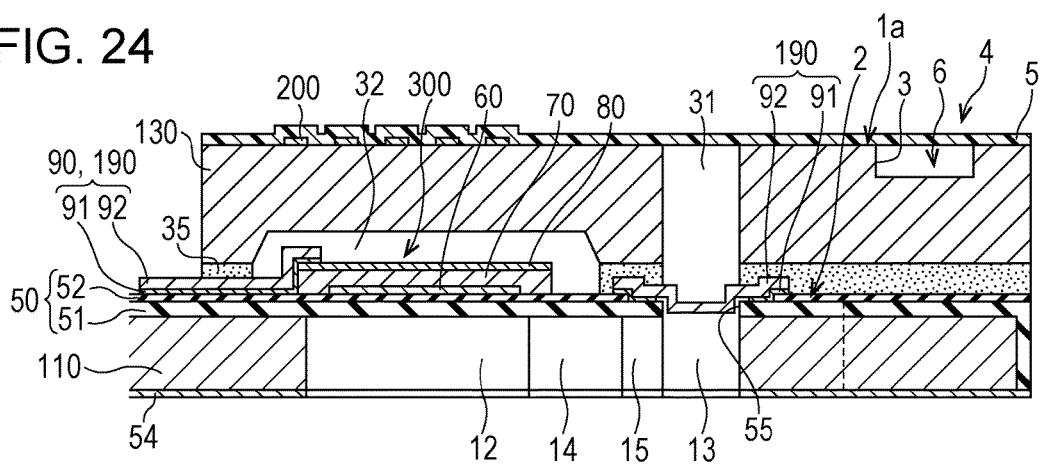
FIG. 24 is a sectional view explaining the manufacturing method of a recording head.

Next, as illustrated in FIG. 24, a part of the wiring layer 190 within the penetrating portion 55 is removed by wet etching (dry etching) from the communication portion 13 side. That is, a region of a part of the adhesion layer 91 and the metal layer 92 diffused by the adhesion layer 91 which are exposed on the communication portion 13 side is removed by etching. As will be described in detail later, therefore, an adhesive force between the protective film 16 formed on the wiring layer 190 in a later step and the wiring layer 190 is weak and the protective film 16 on the wiring layer 190 is easily peeled off.

Figure 25:
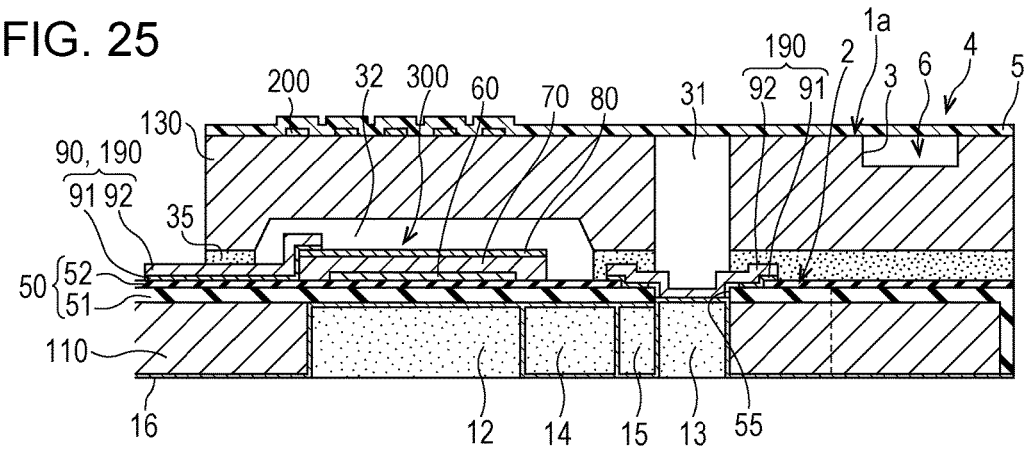
FIG. 25 is a sectional view explaining the manufacturing method of a recording head.

Next, the mask film 54 on the surface of the flow path forming substrate wafer 110 is removed and as illustrated in FIG. 25, for example, the protective film 16 made of a material having liquid resistance (ink resistance) such as oxide or nitride, in the embodiment, tantalum pentoxide is formed by a CVD method, or the like. In this case, since the penetrating portion 55 is sealed by the wiring layer 190, the protective film 16 is not formed on the outer surface of the protective substrate wafer 130 or the like via the penetrating portion 55. Therefore, the protective film 16 is not formed on the surface of the protective substrate wafer 130 on which the connection wiring 200 or the like is formed, generation of connection failure or the like of the driving IC 210 or the like can be prevented, a step of removing the excessive protective film 16 becomes unnecessary, a manufacturing process can be simplified, and thereby the manufacturing cost can be reduced.

Figure 26:
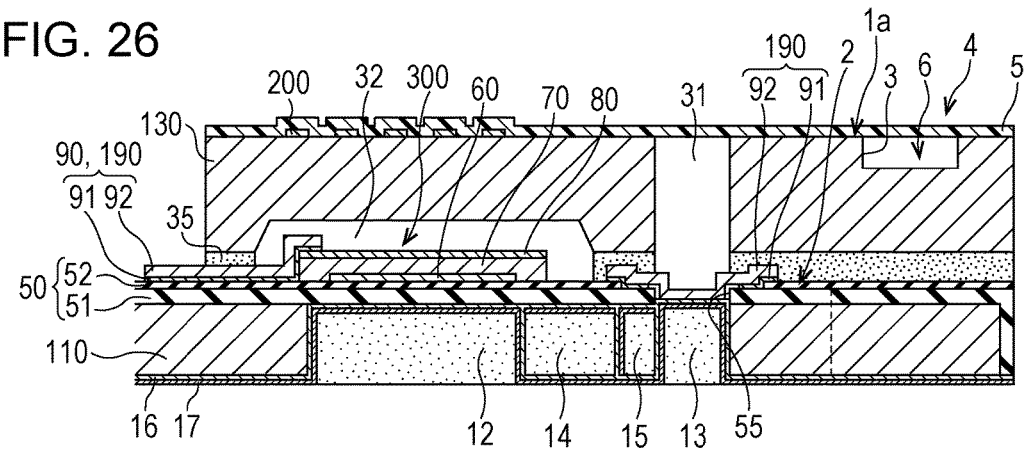
FIG. 26 is a sectional view explaining the manufacturing method of a recording head.

Next, as illustrated in FIG. 26, the peeling layer 17 made of a high stress material is formed on the protective film 16, for example, by the CVD method. It is preferable that the internal stress of the peeling layer 17 be compressive stress and, particularly, it is desirable that the peeling layer 17 has the compressive stress of 80 MPa or more. In addition, it is preferable that the peeling layer 17 be made of a material having an adhesive force to the protective film 16 greater than an adhesive force between the protective film 16 and the wiring layer 190. In the embodiment, as the material of the peeling layer 17, a titanium tungsten compound (TiW) is used.

Figure 27:
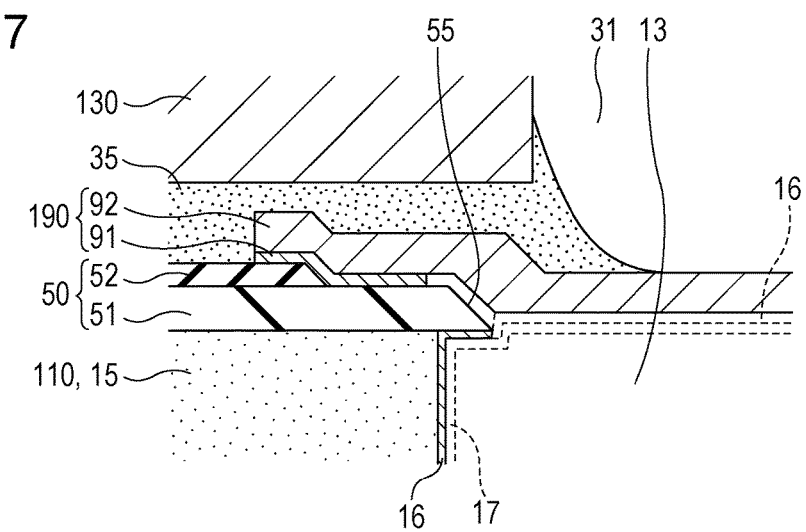
FIG. 27 is a sectional view explaining the manufacturing method of a recording head.

As described above, if the peeling layer 17, which is made of the high stress material and has high adhesive force to the protective film 16, is formed on the protective film 16, the protective film 16 formed on the wiring layer 190 begins to peel off by the stress of the peeling layer 17. As illustrated in FIG. 27, the protective film 16 on the wiring layer 190 is completely removed together with the peeling layer 17 by removing the peeling layer 17 by wet etching. Moreover, in the embodiment, a part of the wiring layer 190 provided in the penetrating portion 55 in the above-described step, that is, the adhesion layer 91 and the metal layer 92 diffused by the adhesion layer 91 are removed so that the adhesive force between the wiring layer 190 and the protective film 16 is weak and the protective film 16 can be easily peeled off from the wiring layer 190.

Figure 28:
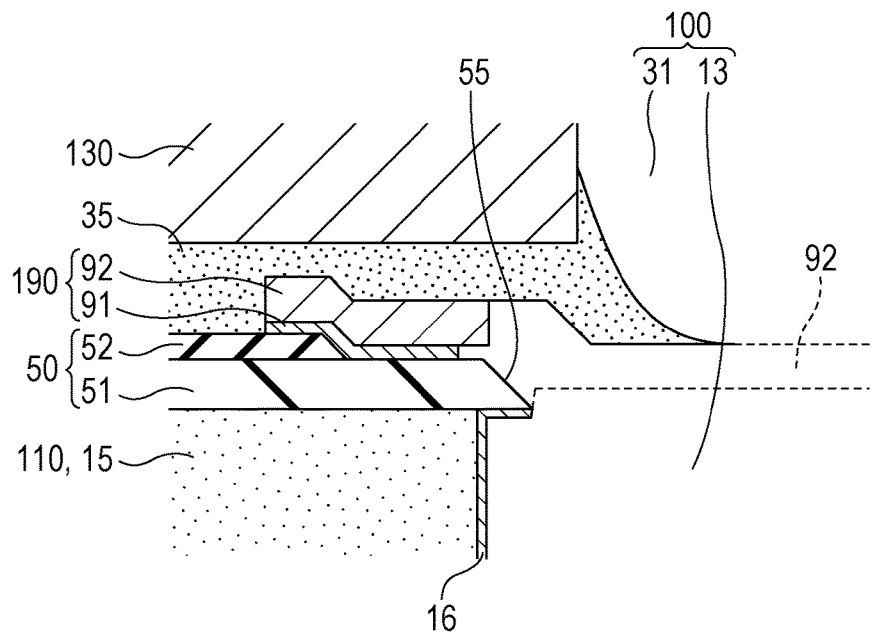
FIG. 28 is a sectional view explaining the manufacturing method of a recording head.

As described above, after the protective film 16 on the wiring layer 190 is removed, as illustrated in FIG. 28, the metal layer 92 is removed by wet etching from the communication portion 13 side and thereby the penetrating portion 55 is opened. In this case, since the protective film 16 is not formed on the metal layer 92, the protective film 16 does not an obstacle in wet etching of the metal layer 92. Therefore, the metal layer 92 is easily and reliably removed by wet etching and the penetrating portion 55 can be opened.

Figure 29:
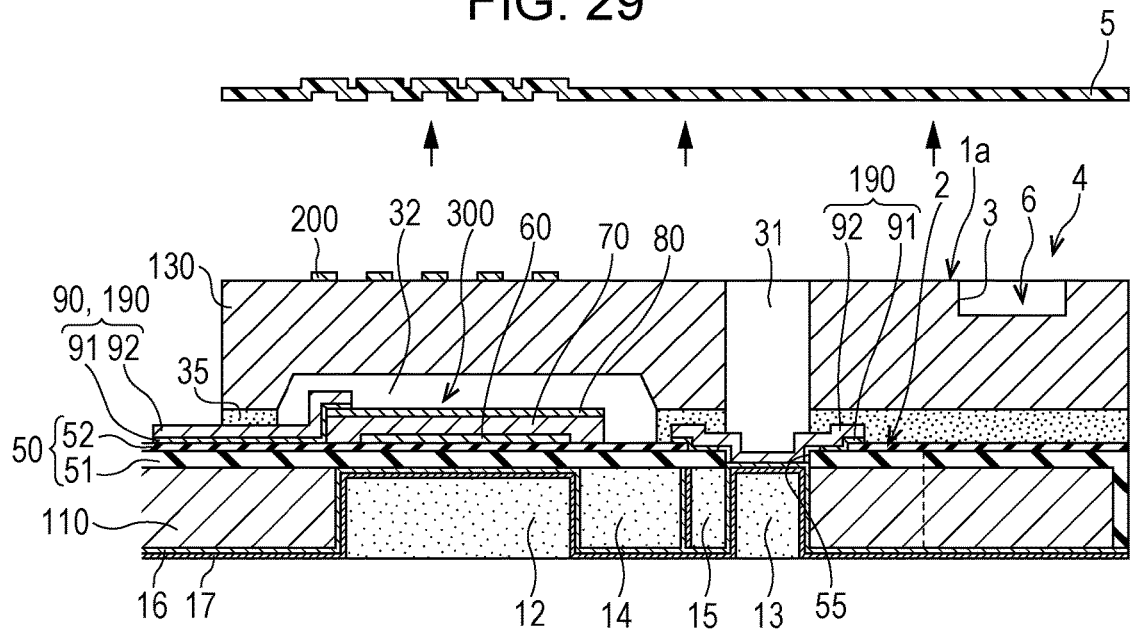
FIG. 29 is a sectional view explaining the manufacturing method of a recording head.

Next, as illustrated in FIG. 29, the cover member 5 of the protective substrate wafer 130 is peeled off. The peeling method of the cover member 5 can be the same as the above-described method. The heating temperature of the protective substrate wafer 130 in the pressure adjusting step is necessary to be a temperature that does not adversely influence the piezoelectric actuator 300, the lead electrode 90, the connection wiring 200, or the like.

Thereafter, the driving IC 210 is mounted on the connection wiring 200 formed on the protective substrate wafer 130 and the driving IC 210 and the lead electrode 90 are connected by the drive wiring 220 (see FIG. 14). An unnecessary portion of the outer peripheral edge portion of the flow path forming substrate wafer 110 and the protective substrate wafer 130 is removed by, for example, cutting by dicing or the like. That is, the region in which the recessed portion 3 is formed is cut and removed. The flow path forming substrate wafer 110 and the protective substrate wafer 130 are divided into one chip size flow path forming substrate 10 or the like as illustrated in FIG. 14, and then the nozzle plate 20 in which the nozzle openings 21 are bored is joined to the surface of the flow path forming substrate wafer 110 on the side opposite to the protective substrate wafer 130, and the compliance substrate 40 is joined to the protective substrate wafer 130, and thereby the ink jet type recording head having the structure as described above can be manufactured.

As described above, when the cover member 5 is peeled off from the protective substrate wafer 130 by using the peeling method of the cover member which is described above in the manufacturing method of the ink jet type recording head I, it is possible to suppress occurrence of peeling failure and warpage of the flow path forming substrate wafer 110 and the protective substrate wafer 130 is reduced, and thereby it is possible to suppress occurrence of destruction such as cracks.

Other Embodiments

Above, the embodiments of the invention are described, but a basic configuration of the invention is not limited to the above-described configuration.

For example, in the above-described Embodiment 1, the substrate 1 (protective substrate wafer 130) is heated in the pressure adjusting step and thereby the gas within the space 6 is expanded and thereby the pressure within the space 6 is higher than that of the outside of the space 6, but it is not particularly limited to this. For example, by reducing the pressure of the outside of the space 6, that is, by reducing the pressure of the atmospheric environment of the substrate 1 (the protective substrate wafer 130 and the flow path forming substrate wafer 110), the air pressure within the space 6 may be relatively higher than that of the outside of the space 6. As described above, in a case where the air pressure within the space 6 is increased by reducing the pressure of the outside of the space 6, there is no need to heat the substrate 1 (the protective substrate wafer 130 and the flow path forming substrate wafer 110), and it is possible to reduce adverse influence due to heat to the piezoelectric actuator 300, the lead electrode 90, the connection wiring 200, or the like. In addition, the pressure adjustment within the space 6 can be performed with high accuracy and an protrusion amount of the cover member 5 on the side opposite to the recessed portion 3 can be controlled with high accuracy by adjusting the pressure within the space 6 by reduction of the pressure compared to a case where the substrate 1 is heated. Therefore, the cover member 5 can be peeled off easily and with high accuracy. However, in a case where the pressure within the space 6 is adjusted by the reduction of the pressure, the device is large in size compared to a case where the substrate 1 is heated. That is, adjusting the pressure within the space 6 by heating the substrate 1 can be carried out at low cost.

In addition, in the above-described Embodiment 1, the holding member 8 sucks and holds the surface of the cover member 5, but it is not particularly limited to this, and the holding member 8 may be held by bonding to the surface of the cover member 5 with an adhesive or the like. In addition, when the holding member 8 is bonded to the cover member 5, a flexible material such as a tape may be used as the holding member 8.

In addition, in the above-described Embodiment 1, in the manufacturing method of the ink jet type recording head I, when the pressure generating chamber 12 or the like is formed on the flow path forming substrate wafer 110 by wet etching, and the wiring layer 190 closing the penetrating portion 55 is penetrated by wet etching, the surface of the protective substrate wafer 130 on the side opposite to the flow path forming substrate wafer 110 is protected by the cover member 5, but the peeling method of the cover member of the invention may also be used in another step.

In addition, in the above-described Embodiment 1, the thin film type piezoelectric actuator 300 is described as the pressure generating unit that generates a change in pressure in the pressure generating chamber 12, but it is not particularly limited to this. For example, a thick film type piezoelectric actuator formed by a method of attaching a green sheet or the like, a longitudinal vibration type piezoelectric actuator which expands and contracts in an axial direction by alternately stacking a piezoelectric material and an electrode forming material, and the like can be used. In addition, as the pressure generating unit, a unit in which a heating element is disposed within a pressure generating chamber and liquid droplets are ejected from the nozzle opening by bubbles generated by heat generation of a heating element, a so-called electrostatic actuator which generates static electricity between a vibration plate and an electrode and deforms the vibration plate by an electrostatic force and ejects liquid droplets from the nozzle opening, or the like can be used.

Moreover, in Embodiment 1, as an example of the liquid ejecting head, the ink jet type recording head is described, but the invention is widely applied to a liquid ejecting head and can naturally be applied to a liquid ejecting head and a liquid ejecting device which eject a liquid other than the ink. Examples of other liquid ejecting heads include various recording heads used in an image recording apparatus such as a printer, a color material ejecting head used for manufacturing a color filter such as a liquid crystal display, an electrode material ejecting head used for forming an electrode such as an organic EL display and a field emission display (FED), a bioorganic material ejecting head used for manufacturing a bio chip, and the like.

The entire disclosure of Japanese Patent Application No. 2016-241648, filed Dec. 13, 2016 is expressly incorporated by reference herein.

What is claimed is:

1. A method for peeling a cover member off of a substrate, the method comprising:
    forming a recessed portion that opens to one side surface of a substrate, wherein the recessed portion does not completely penetrate the substrate and is formed in a region of the substrate different from a region in which a pattern is formed in the substrate, and forming an opening region including the opening of the recessed portion, on the one side surface of the substrate;
    attaching the cover member so as to cover the one side surface of the substrate including the opening region and the pattern;
    adjusting a pressure for increasing a pressure within a space formed by the recessed portion and the attached cover member to be higher than a pressure on a side opposite to the space with the cover member interposed therebetween; and
    peeling off the cover member from the substrate, in a state where the pressure within the space is increased by the adjusting of the pressure.

2. The method according to claim 1,
    wherein in the peeling off of the cover member, a region, which is a surface of the cover member on a side opposite to the substrate, and includes at least a part of a region that overlaps with the opening region of the substrate, is pulled in a direction away from the substrate when viewed in a plan view from a stacking direction of the cover member and the substrate.

3. The method according to claim 2,
wherein the region for pulling the cover member includes a portion adjacent to the opening region in a region closer to an outer periphery side of the substrate than the opening region when viewed in a plan view from the stacking direction of the cover member and the substrate.

4. The method according to claim 1,
wherein in the adjusting of the pressure, the pressure within the space is increased by heating the substrate.

5. The method according to claim 4,
wherein a temperature of the substrate in the adjusting of the pressure is higher than a temperature of the substrate in the attaching of the cover member.

6. The method according to claim 1,
wherein a temperature of the substrate after the attaching of the cover member before the adjusting of the pressure is lower than a temperature of the substrate of the attaching of the cover member.

7. The method according to claim 1,
wherein in the forming of the opening region, a plurality of the groove-shaped recessed portions are juxtaposed in a direction intersecting an extension direction of the recessed portions.

8. The method according to claim 1,
wherein in the forming of the opening region, a plurality of columns in which the plurality of the recessed portions are juxtaposed are arranged in a direction intersecting a juxtaposing direction in which the recessed portions are juxtaposed.

9. The method according to claim 1,
wherein the peeling off of the cover member includes
moving gas within the space to an outer periphery of an interface between the substrate and the cover member, and
pinching and peeling off an end portion of the cover member which is peeled off from the substrate, by the gas moved in the moving of the gas.

10. A manufacturing method of a liquid ejecting head comprising:
the method according to claim 1.

11. A manufacturing method of a liquid ejecting head comprising:
the method according to claim 2.

12. A manufacturing method of a liquid ejecting head comprising:
the method according to claim 3.

13. A manufacturing method of a liquid ejecting head comprising:
the method according to claim 4.

14. A manufacturing method of a liquid ejecting head comprising:
the method according to claim 5.

15. A manufacturing method of a liquid ejecting head comprising:
the method according to claim 6.

16. A manufacturing method of a liquid ejecting head comprising:
the method according to claim 7.

17. A manufacturing method of a liquid ejecting head comprising:
the method according to claim 8.

18. A manufacturing method of a liquid ejecting head comprising:
the method according to claim 9.

* * * * *